United States Patent
Schlitz (10) Patent No.: US 7,661,468 B2
(45) Date of Patent: Feb. 16, 2010

(54) ELECTRO-HYDRODYNAMIC GAS FLOW COOLING SYSTEM

(75) Inventor: Daniel Jon Schlitz, Lilburn, GA (US)

(73) Assignee: Ventiva, Inc., Santa Clara, CA (US)

( * ) Notice: Subject to any disclaimer, the term of this patent is extended or adjusted under 35 U.S.C. 154(b) by 219 days.

(21) Appl. No.: 11/338,617

(22) Filed: Jan. 23, 2006

(65) Prior Publication Data

US 2006/0169441 A1 Aug. 3, 2006

Related U.S. Application Data (60) Provisional application No. 60/646,750, filed on Jan. 24, 2005.

(51) Int. Cl.
*F24H 3/02* (2006.01)
*F24F 7/00* (2006.01)
*H02K 44/02* (2006.01)

(52) U.S. Cl. .................. 165/121; 417/50; 165/80.3
(58) Field of Classification Search ............... 165/80.3, 165/96, 120, 121; 417/50
See application file for complete search history.

(56) References Cited

U.S. PATENT DOCUMENTS

| | | | |
|---|---|---|---|
| 3,267,860 A | | 8/1966 | Brown |
| 3,872,917 A | * | 3/1975 | Blomgren et al. ............. 165/96 |
| 4,038,583 A | | 7/1977 | Breton |
| 4,185,316 A | | 1/1980 | Fleck |
| 4,210,847 A | * | 7/1980 | Shannon et al. ........ 315/111.91 |
| 4,316,233 A | | 2/1982 | Chato et al. |
| 4,380,720 A | | 4/1983 | Fleck |
| 4,559,467 A | | 12/1985 | Beckmann et al. |
| 4,953,407 A | | 9/1990 | Malaczynski et al. |
| 5,237,281 A | | 8/1993 | Webster et al. |
| 5,434,469 A | | 7/1995 | Cirri |
| 5,769,155 A | * | 6/1998 | Ohadi et al. ............. 165/109.1 |

(Continued)

FOREIGN PATENT DOCUMENTS

WO  WO 99/35893  7/1999

(Continued)

OTHER PUBLICATIONS

Ahn, et al., Fabrication and Experiment of a Plantar Micro Ion Drag Pump, Sensors and Actuators, pp. 1-5, (1998).

(Continued)

*Primary Examiner*—Teresa J Walberg
(74) *Attorney, Agent, or Firm*—Pillsbury Winthrop Shaw Pittman LLP (57) ABSTRACT

The present invention relates to cooling systems, and in particular to cooling systems providing forced convective gaseous flow. According to one aspect, a cooling system employs a heat sink in combination with an EHD pumping mechanism such as corona wind or micro-scale corona wind or by a temporally controlled ion-generation technique. A channel-array structure can be employed to embody the heat sink. The EHD pumps are located at the inlet or outlet of the heat sink channels. Many advantages are achieved by the cooling system of the invention, including that the entire system can have similar or better performance than a conventional heat sink and fan system but with one-tenth the volume and weight and can operate silently. The present invention also relates to a method of fabricating a micro-channel heat sink employing EHD gas flow.

40 Claims, 9 Drawing Sheets

U.S. PATENT DOCUMENTS

| | | | |
|---|---|---|---|
| 5,841,235 | A | 11/1998 | Engelko et al. |
| 5,973,905 | A | 10/1999 | Shaw |
| 5,977,716 | A | 11/1999 | Motouchi |
| 5,982,102 | A * | 11/1999 | Andrzej ................. 315/111.91 |
| 6,061,074 | A | 5/2000 | Bartha et al. |
| 6,373,680 | B1 | 4/2002 | Riskin |
| 6,374,909 | B1 * | 4/2002 | Jeter et al. .................... 165/96 |
| 6,409,975 | B1 * | 6/2002 | Seyed-Yagoobi et al. ..... 165/96 |
| 6,522,536 | B2 * | 2/2003 | Brewer et al. .............. 165/80.3 |
| 6,659,172 | B1 | 12/2003 | Dewar et al. |
| 6,703,785 | B2 | 3/2004 | Aiki et al. |
| 6,779,594 | B1 * | 8/2004 | Judge et al. ................... 165/96 |
| 6,937,455 | B2 | 8/2005 | Krichtafovitch et al. |
| 7,190,587 | B2 | 3/2007 | Kim et al. |
| 2003/0090209 | A1 | 5/2003 | Krichtafovitch |
| 2003/3090209 | | 5/2003 | Krichtafovitch et al. |
| 2003/0203245 | A1 * | 10/2003 | Dessiatoun et al. ............ 429/8 |
| 2004/0155612 | A1 | 8/2004 | Krichtafovitch et al. |
| 2004/0190254 | A1 | 9/2004 | Hu et al. |
| 2004/0244406 | A1 | 12/2004 | Savitsky et al. |
| 2004/0250994 | A1 | 12/2004 | Chordia et al. |
| 2005/0007726 | A1 | 1/2005 | Schlitz et al. |
| 2006/0005946 | A1 | 1/2006 | Borgstrom et al. |
| 2006/0011325 | A1 | 1/2006 | Schlitz |
| 2007/0046219 | A1 | 3/2007 | Krichtafovitch et al. |

OTHER PUBLICATIONS

Belhadj, CA et al., Corona Wind Velocity: Parametric Approach, IEE Conf. Ele. Insul. Dielec. Phenomena, pp. 489-492.

Bondar et al., Effect of Nuetral Fluid Velocity on Direct Conversion from Electrical to Fluid Kinetic Energy in an Electro-Fluid Dynamics Device, J. Phys. D. App. Phys., pp. 1657-1663, (1986).

Boulos, M., et al., Thermal Plasmas-Fundementals and Applications, Plenum Press (New York), (1994).

Colver, GM, et al., Modeling of DC Corona Discharge Along an Electrically Conductive Flat Plate with Gas Flow, IEEE Trans. on Indust. Apps., vol. 35 (No. 2), (Mar./Apr. 1999).

Franke, et al., Corona Wind Cooling of Horizontal Cylinders in Air, ASME/JSME Thermal Eng. Conf., pp. 261-267, (1995).

Fuhr, et al., Travelling Wave-Driven Microfabricated Electrohydrodynamic Pumps for Liquids, J. Micromech. Microeng., pp. 217-226, (1994).

Hirsch, Merele N., Gaseous Electronics, HJ Oskam Academic Press (New York), pp. 222-223, (1978).

Kalman, H., et al., Enhancement of Heat Transfer by Means of a Corona Wind Created by a Wire Electrode and Confined Wings Assembly, App. Therm. Eng., vol. 101 (No. 21), pp. 265-282, (2001).

Kucerovsky, et al., "Corona Wind in a System with the Pin-to-Plan Discharge Geometry," IEEE Ind. App. Soc 34th Ann. Meet., p. 14019.

Loeb, L., "Fundemental Processing of Electrical Discharges in Gases," Wiley & Sons (London), p. 514-521.

Nasser, E., "Fundementals of Gaseous Ionization and Plasma Electronics," Wiley Intersciences (New York), p. 296-311.

Ohadi, MM, et al., "Heat Transfer Enhancement of Laminar and Turbulent Pipe Flow Via Corona Discharge," Int. J. Heat Mass. Transfer, vol. 34 (No. 4/5), p. 1175-1187.

Owsenek, J., et al., "Theoretical and Experiemental Study of Electrohydrodynamic Heat Transfer Enhancement Through Wire Plate Corona Discharge," Trans. of the AMS, p. 604-610.

Owsenek, et al., "Experimental Investigation of Corona Wind Heat Transfer Enhancement with a heated Horizontal Flat Plate," J. of Heat Transfer, p. 309-315.

Pickard, WM. F, "Ion Drag Pumping—I. Theory," J. App. Phys., vol. 34 (No. 2), p. 246-250.

Robinson, "Movement of Air in the Electric Wind of the Corona Discharge," Am. Inst. Elec. Eng. Comm. Electron. OIEE J., 1st ed., p. 143-150.

Schlitz, D., et al., "Microscale Ion-driven Air Flow Over a Flate Plate," Proc. Of NHTC: ASME 2004 Heat Transfer/Fluids Eng. Summer Conf, p. 1-6.

Schlitz, D., et al., "Numerical Simulation of Microscale Ion-Driven Air Flow," Proc. Of IMECE: ASME Int'l Mech. Eng. Congress, p. 1-8.

Shin, et al., "High-Temperature Electron Emission from Diamond Films," J. Vac. Sci, vol. B21 (No. 1), p. 587-592.

Singhal, V., et al., "Influence of Bulk Fluid Velocity on the Efficiency of Electrohydrodynamic Pumping," a white paper, p. 1-39.

Sobhan, et al., "A Comparative Analysis of Studies on Heat Transfer and Fluid Flow in Microchannel," Microscale Thermophys Eng., p. 293-311.

Stuetzer, O., et al., "Ion Drag Pumps," J. Appl, Phys., p. 136-146.

Stuetzer, O., et al., "Ion Drag Pressure Generation," J. App. Phys., vol. 30 (No. 7), p. 984-994.

Tuckerman, et al., "High Performance Heat Sinking for VLSI," IEEE Elect. Device. Lett., vol. EDL (No. 5), p. 126-129.

Wong, et al., "Development of a Micropump for Microelectronic Cooling," MEMS ASME, p. 239-244.

Yang, F., et al., "Corona Driven Air Propulsion for Cooling of Electronics," XIIIth Int'l Symp. On High Volt.. Eng., p. 1-4.

Zhao, L., et al., "EHD Flow in Air Produced by Electric Coronoa Discharge in Pin-Plate Configuration," J. of Electrostatics, p. 337-350.

Supplemental Search Report issued Jun. 11, 2008 in corresponding European application.

* cited by examiner

ELECTRO-HYDRODYNAMIC GAS FLOW COOLING SYSTEM

CROSS-REFERENCE TO RELATED APPLICATIONS

The present application is based on, and claims priority from, U.S. Provisional Appln. No. 60/646,750, filed Jan. 24, 2005, commonly owned by the present assignee, the contents of which are incorporated herein by reference.

STATEMENT REGARDING FEDERALLY SPONSORED RESEARCH

The United States Government may have certain rights in connection with the present invention arising out of National Science Foundation contract No. DMI-0522126.

FIELD OF THE INVENTION

The present invention relates to cooling systems, and more particularly to cooling systems employing forced-convection gas flow through heat sinks.

BACKGROUND

It is well known that heat can be a problem in many environments, and that overheating can lead to failure of components such as integrated circuits (e.g. a central processing unit (CPU) of a computer) and other electronic components. Heat sinks are a common device used to prevent overheating. Heat sinks rely mainly on the dissipation of heat from the device using air. However, dissipating heat using a gas, such as air, is difficult because of the poor thermal properties of gases. Gases have low thermal conductivities, which inhibits heat absorption. They also have low heat capacity, which causes them to heat up quickly after absorbing only a small amount of heat. This retards the rate and the amount of heat absorption by decreasing the temperature difference between the gas and the heat sink.

Conventional heat sinks have a limited amount of surface area that can be put into a given volume. As a result, these heat sinks are large, especially in the direction perpendicular to the heat source and substrate. Additionally, these heat sink designs do not integrate well with certain types of fluid pump designs.

A novel heat sink described in U.S. patent application Ser. No. 11/181,106, filed Jul. 13, 2005, and entitled "Micro-Channel Heat Sink," the contents of which are incorporated by reference herein, dramatically advances the state of the art of heat sinks. It describes a structure comprised of a large array of relatively short micro-channels that allows heat to be more readily transported through short, low thermal resistant paths. As a result, heat sinks based on this concept have a fraction of the volume of traditional heat sinks while maintaining high performance cooling.

The heat sink described in U.S. patent application Ser. No. 11/181,106 and other more conventional heat sink designs typically rely on fans and blowers to promote flow of gases through their structures. Meanwhile, other techniques have been developed that directly convert electricity into fluid flow. These methods are collectively referred to as electro-hydrodynamic (EHD) pumps. One of these methods of pumping a gas is called corona wind. It refers to the gas flow that is established between two electrodes, one sharp and the other blunt, when a high voltage is applied between the electrodes. The gas is partially ionized in the region of high electric field near the sharp electrode. The ions that are attracted to the more distant, blunt electrode collide with neutral molecules en route and create a pumping action.

Another type of EHD pump is described in U.S. patent application Ser. No. 11/271,092, entitled "Ion Generation by the Temporal Control of Gaseous Dielectric Breakdown," filed on Nov. 10, 2005, the contents of which are incorporated herein by reference. In this method, ions are generated by a temporally controlled breakdown of the gas and are then attracted to oppositely charged electrodes to create a pumping action.

U.S. Patent Publication No. 2005/0007726 A1, entitled "Ion-Driven Air Flow Device and Method," relates to an ion-driven, fluid flow generating microscale pump device and method for creating a flow of gaseous fluid for the purpose of cooling solid objects. The ion generation involves an electron tunneling process and the EHD pumping uses a traveling electric field concept. The concepts of this patent application are interesting but are impractical and complex in many respects.

U.S. Pat. No. 6,659,172, entitled "Electro-hydrodynamic heat exchanger" relates to a counter flow heat exchanger with EHD enhanced heat transfer. The flow is not primarily driven by an EHD pump, but rather an external device of some kind. The EHD action presumably creates secondary flows that enhance the heat transfer rate of the system and improve its performance.

U.S. Pat. No. 4,210,847, entitled "Electric wind generator" discloses a corona wind pump to provide air flow for heat transfer purposes. However, there is no mention of heat sink integration.

U.S. Pat. No. 4,380,720, entitled "Apparatus for producing a directed flow of a gaseous medium utilizing the electric wind principle" discloses a corona wind device for moving air. It includes an aerosol addition that enhances the electro-hydrodynamic coupling, i.e. it increases the efficiency of the pumping action.

U.S. Pat. No. 5,237,281 entitled "Ion drag air flow meter" and U.S. Pat. No. 4,953,407 entitled "Ion-drag flowmeter" disclose reverse corona wind devices that measure the ion current to determine the air flow velocity.

The above prior art teach concepts that are interesting, but applying them to effective heat sink structures remains a problem. It would be desirable to have a heat sink design with improved gas flow characteristics over that of a traditional fan or passive techniques, along with a structure that could support and effectively employ more advanced gaseous flow techniques.

SUMMARY

The present invention relates to cooling systems, and in particular to cooling systems providing forced convective gaseous flow. According to one aspect, a cooling system employs a heat sink in combination with an EHD pumping mechanism such as corona wind or micro-scale corona wind or by a temporally controlled ion-generation technique. A channel-array structure can be employed to embody the heat sink. The EHD pumps are located at the inlet or outlet of the heat sink channels. Many advantages are achieved by the cooling system of the invention, including that the entire system can have similar or better performance than a conventional heat sink and fan system but with one-tenth the volume and weight and can operate silently.

According to one aspect, a cooling apparatus according to the invention comprises a channel and an electro-hydrodynamic (EHD) pump coupled to the channel that forces gas to flow through the channel.

According to another aspect, a cooling apparatus according to the invention comprises a heat sink comprising a plurality of channels and a plurality of electro-hydrodynamic (EHD) pumps coupled to the channels that respectively force gas to flow through the channels.

According to another aspect, a method of fabricating a cooling apparatus according to the invention comprises using a single process to commonly form an electro-hydrodynamic pump structure and a heat sink structure.

According to another aspect, an electro-hydrodynamic (EHD) pump for creating a micro-scale corona wind according to the invention comprises a first electrode separated from a second electrode by a gas gap of less than 1 cm, wherein the first electrode has an effective diameter, and wherein a ratio of the gas gap to the effective diameter is greater than 6:1.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION OF THE PREFERRED EMBODIMENTS

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not necessarily be so limited; rather the principles thereof can be extended to other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

Generally, the present invention relates to cooling systems that employ forced convection gaseous flow through a heat sink structure, preferably using EHD techniques. The EHD flow is preferably generated by one of three mechanisms that will be described in detail herein; (1) corona wind, (2) micro-scale corona wind or (3) by the method described in the U.S. patent application Ser. No. 11/271,092, entitled "Ion Generation by the Temporal Control of Gaseous Dielectric Breakdown," filed on Nov. 10, 2005, the contents of which are incorporated herein by reference. However, the EHD flow can also be generated by a combination of two or more of these three mechanisms, or by other present and future EHD mechanisms, or in combination with other conventional mechanisms such as fans, while remaining within the teachings of the present invention.

Figure 1:
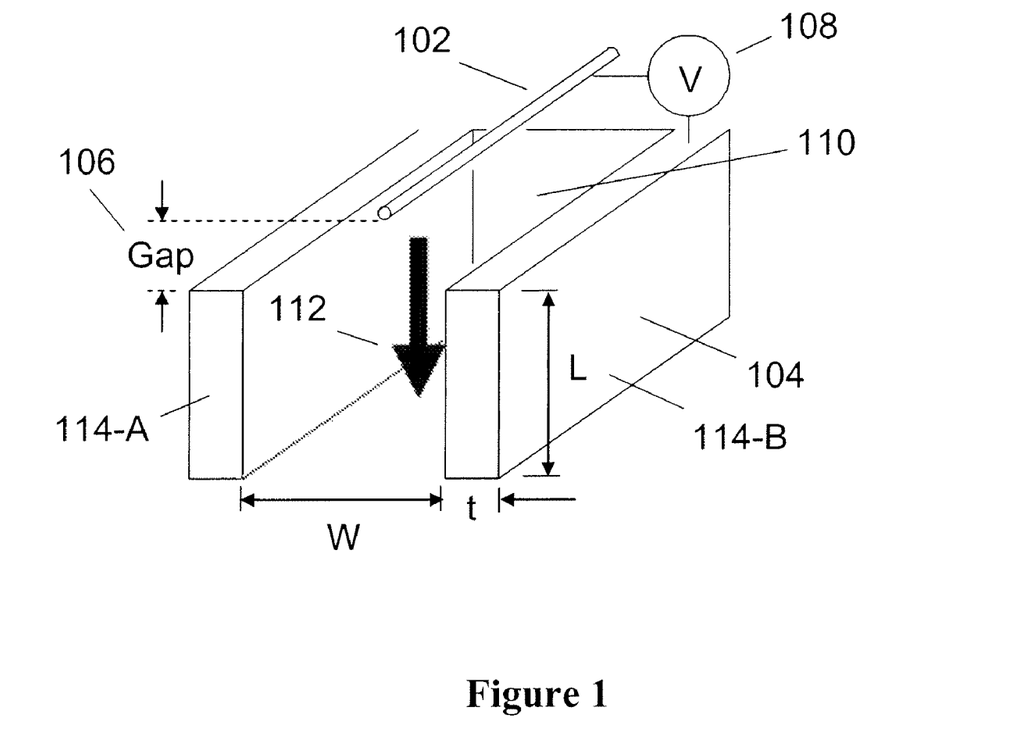
FIG. 1 is a perspective view of one preferred embodiment of an EHD gas flow cooling system according to the invention.

FIG. 1 illustrates an example cooling system according to the invention. As shown in FIG. 1, a first electrode 102 is separated from a second electrode 104 by a gas (e.g. air) gap 106. According to an aspect of the invention, the second electrode 104 is integrally formed in a portion of a heat sink, and the first and second electrodes are disposed near the inlet of a heat sink channel 110. A voltage source 108 is coupled to the electrodes 102, 104, and establishes an electric field across the gas gap 106 which generates ions according to one of the techniques as will be described in more detail below. The ion generation across the gap 106 imparts momentum to the gas, which causes gas to flow through the channel 110, in a direction 112 from its inlet to its outlet. The gas flow through the channel 110 facilitates removal of heat from the heat sink, and in turn acts to remove heat from a source of heat that is thermally coupled to the heat sink, as will be understood by those skilled in the art.

In one example embodiment, the heat sink material is an electrically conductive material such as aluminum, to which the voltage source 108 is directly connected via any number of connection means known to those skilled in the art, and thus acts as the second electrode 104. The first electrode 102 in some examples can be an aluminum, copper or other type of electrically conductive wire, or it can be a patterned conductor on a dielectric material, and thus is not limited to a round shape, as will become more apparent from the descriptions below.

In the illustrated example, the channel 110 is defined by a heat sink fin 114-A that is separated by another fin 114-B. The various orientations, materials, geometries and dimensions of certain of the illustrated elements can depend on the ion-generation techniques used, and will become more apparent from the descriptions below. However, it should be noted that a cooling system according to the invention can contain many channels 110, defined by fins or other heat sink structures, all or certain of which will be equipped with ion-generating electrodes for causing a gas flow therethrough. It should be further noted that similar results can be obtained by providing the electrodes near the outlet of a channel rather than the inlet as illustrated in FIG. 1, and as will be described in more detail herein.

Corona Wind

One EHD pumping method that can be used in the cooling system of the invention, corona wind, has been studied extensively (See O. Stuetzer, "Ion Drag Pressure Generation", J. Applied Physics, V. 30, N. 7, pp. 984-994, 1959; B. L. Owsenek, J. Seyed-Yagoobi, "Theoretical and Experimental Study of Electrohydrodynamic Heat Transfer Enhancement Through Wire-Plate Corona Discharge", J. Heat Transfer, V. 119, pp. 604-610, 1997; H. Kalmen and E. Sher, "Enhancement of heat transfer by means of a corona wind created by a wire electrode and confined wings assembly", Applied Thermal Eng., 21, pp. 265-282, 2001). It involves two electrodes, one sharp (e.g. first electrode 102), the other blunt (e.g. second electrode 104), spaced apart by a gap (e.g. gap 106) of many centimeters. A large, constant voltage (DC, e.g. source 108) is applied between the electrodes. This creates an intense electric field near the sharp electrode and a weaker electric field in the remainder of the region between the electrodes. Gaseous breakdown is initiated in the high electric field region near the sharp electrode (corona discharge). In this zone, free electrons obtain sufficient energy to create pairs of positive ions and additional free electrons, as they collide with neutral molecules. This action creates an avalanche effect such that a large number of ions are generated in a small volume. Ions produced in this region travel across the gap (e.g. gap 106), under the influence of the electric field, towards the blunt electrode. On the way, they collide with neutral molecules and impart momentum to the bulk gas causing the gas to flow.

Micro-Scale Corona Wind

Another method of EHD pumping that can be used in a cooling system such as that illustrated in FIG. 1, and is itself an additional aspect of the invention, is referred to herein as micro-scale corona wind. A micro-scale corona is a novel extension of the corona wind phenomenon down through the low end of the meso-scale and into the micro-scale. A micro-scale corona is herein defined as a corona discharge between electrodes whose spacing is less than 1 cm—below the minimum gap size reported for conventional coronas.

The micro-scale corona wind, similar to the conventional corona wind, is established as a corona discharge between two electrodes—one blunt (e.g. second electrode 104), the other sharp (e.g. first electrode 102). But in a conventional corona, the ratio of the size of the gas gap (e.g. 106) to the sharp electrode characteristic dimension (effective diameter) is only required to exceed 6:1 (see *Gaseous Electronics*, Editors: Merle N. Hirsh & H. J. Oskam, Academic Press, New York, 1978). The present invention recognizes that, in a micro-scale corona, this minimal ratio no longer applies.

With a micro-scale corona the ionization region must be confined more closely to the sharp electrode. This is accomplished by increasing the gap-to-diameter ratio. This limits the size of the region where ionization occurs and prevents a general breakdown of the gas and the formation of a destructive arc or spark, as the present invention further recognizes is advantageous.

More particularly, the present invention further recognizes that the gap-to-diameter ratio requirement increases beyond 6:1 as gap size decreases. For example, a gas gap of 1.25 mm requires that the ratio exceed 25:1, for smaller gaps the requirement can exceed 100:1. This requirement means that a typical micro-scale corona electrode must be in the range of sub-microns to approximately 10 µm in diameter, but generally less than 100 microns. Larger diameter electrodes will not exhibit a micro-scale corona regime, but will instead go directly from insulating to arcing as the voltage between the electrodes is raised. The size requirement may necessitate the use of micro-fabrication techniques (examples include photolithography, ion milling and laser induced forward transfer, etc.) for the construction of the electrodes.

The micro-scale corona wind is advantageous because the size required for a micro-scale corona is greatly reduced as compared to a conventional corona. This enables the pumping section to be reduced in size and allows individual pumps, and hence heat sink channels (e.g. channels 110), to be spaced more closely. A second advantage of the micro-scale corona is its low turn-on voltage. Typical conventional coronas turn-on, or begin to conduct electricity, at tens of kilovolts, but a micro-scale corona can turn on below 1000 Volts. A reduced voltage can be produced by smaller and cheaper components and makes the system more competitive.

Ion Generation by Controlling Breakdown

A further method of EHD pumping that can be used in a cooling system according to the invention is described in detail in U.S. patent application Ser. No. 11/271,092, entitled "Ion Generation by the Temporal Control of Gaseous Dielectric Breakdown," filed Nov. 10, 2005, the contents of which are incorporated by reference herein. This method includes adding additional electrodes (not shown in FIG. 1) close to the EHD electrodes (e.g. electrodes 102, 104) that initiate the breakdown of the nearby gas. The breakdown process includes applying a short duration (megahertz range frequency) pulse across the gas, between the ion generating electrodes. The pulse is halted before an arc is formed. The resulting breakdown produces ions which are then used for EHD pumping.

The advantages of this technique are that turn-on can occur at lower voltages than either of the above two corona methods. In addition, it does not rely on an electron avalanche, which is difficult to establish with electrode gaps below 100 µm and hence it can be effective in a smaller volume than the corona wind methods. Lastly, since it does not require a sharp electrode, sizes can be increased to simplify fabrication.

Cooling System: Integration of an EHD Pump and Heat sink

As mentioned above and illustrated in FIG. 1, a cooling system according to the invention integrates an EHD gas flow mechanism with a heat sink structure. Various structures and forms of integration will now be described in more detail.

FIG. 1 shows a first preferred embodiment suitable for all three EHD mechanisms mentioned above, although additional electrodes and elements (not shown) may be included for certain EHD mechanisms. As shown in FIG. 1, the first electrode 102 is located at the inlet of heat sink channel 110. The channel is representative of a multi-channel cooling system. The first electrode 102 can be a sharp electrode comprised of a thin wire and the second electrode 104 can be a blunt electrode comprised of a heat sink fin material such as aluminum.

In one corona wind example, gap 106 is about 30 mm, wire 102 has a diameter of about 0.5 mm, voltage source 108 is about 20 kV, fin 114 has a thickness (t) of about 1 mm, and channel 110 has a width (W) of about 5 mm and length (L) of about 100 mm.

In one micro-scale corona wind example, gap 106 is about 2 mm, wire 102 has a diameter of about 2 microns, voltage source 108 is about 1500 V, fin 114 has a thickness (t) of about 0.2 mm, and channel 110 has a width (W) of about 0.5 mm and length (L) of about 5 mm.

In one ion-generation breakdown control example, gap 106 is about 2 mm, wire 102 has a diameter of about 50 microns, voltage source 108 is about 1000 V, fin 114 has a thickness (t) of about 0.2 mm, and channel 110 has a width (W) of about 0.5 mm and length (L) of about 5 mm.

Figure 2:
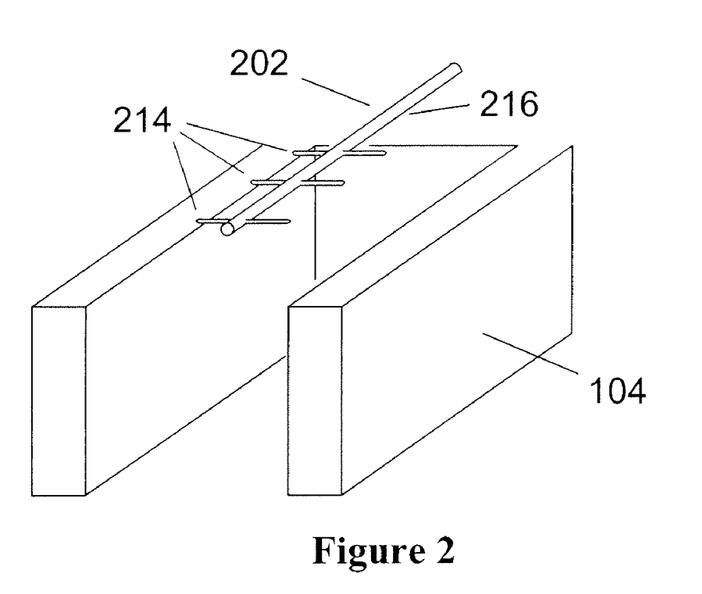
FIG. 2 is a perspective view of another preferred embodiment of a cooling system according to the invention.

The present invention recognizes that enhancing the electric field strength at the first electrode (e.g. electrode 102) is important, especially in the establishment of a micro-scale corona. As set forth above, if the field strength at the first electrode is not sufficiently enhanced above the nominal value, then a corona will not form. To address this issue, another preferred embodiment is shown in FIG. 2 where first electrode 202 consists of a primary member with multiple electrodes 214 protruding from its sides. Each of the secondary tips 214 enhances the electric field beyond that found on the main element 216. Design of the secondary electrodes (length, spacing and effective diameter) can be optimized to maximize electric field enhancement and gas flow, while minimizing turn-on voltage and power consumption. In one example where gap 106 is about 2 mm and voltage 108 is about 1500 V, tips 214 are about 100 microns long, spaced by about 200 microns and have a diameter of about 2 microns.

Figure 3:
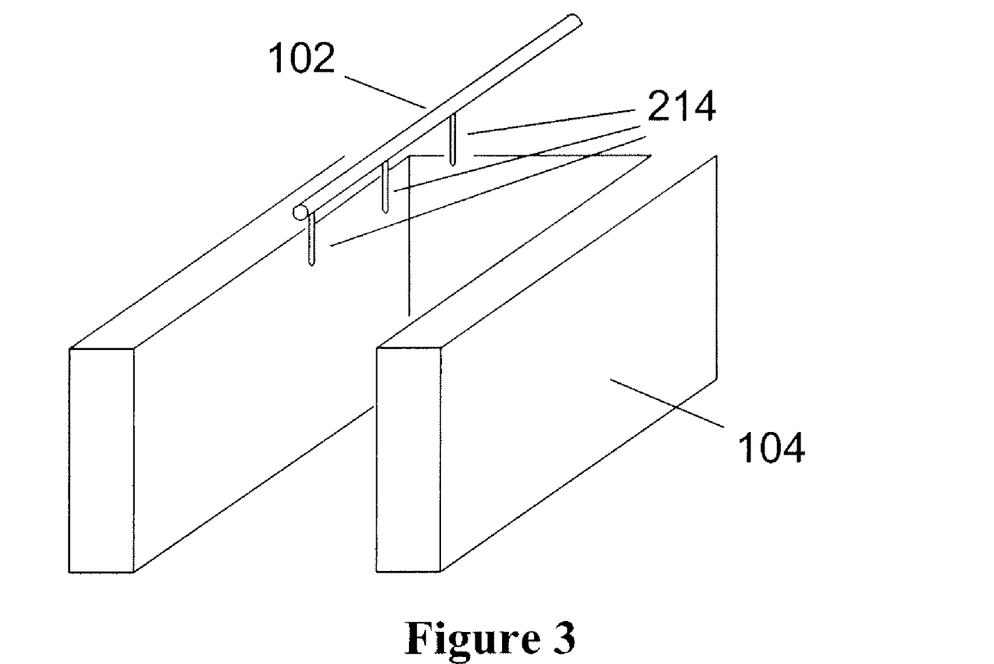
FIG. 3 is a perspective view of another preferred embodiment of a cooling system according to the invention.

FIG. 3 shows another preferred embodiment that is similar to FIG. 2 except that the orientation of the secondary electrodes 214 is in the streamwise direction.

Figure 4:
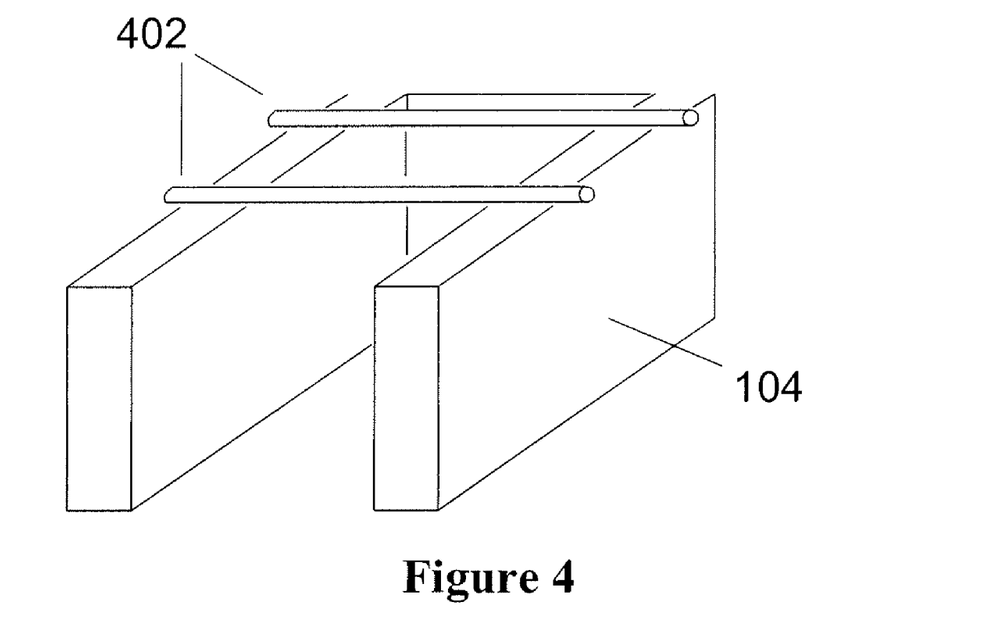
FIG. 4 is a perspective view of another preferred embodiment of a cooling system according to the invention.

FIG. 4 shows another preferred embodiment employing multiple first electrodes for a single channel and second electrode. As shown in FIG. 4, rather than a single first electrode being oriented in a direction parallel to the heat sink structure associated with a corresponding second electrode (e.g. fin 112), two or more first electrodes 402 are oriented perpendicularly to the orientation of the second electrode (e.g. integrated in a heat sink fin 114).

Figure 5:
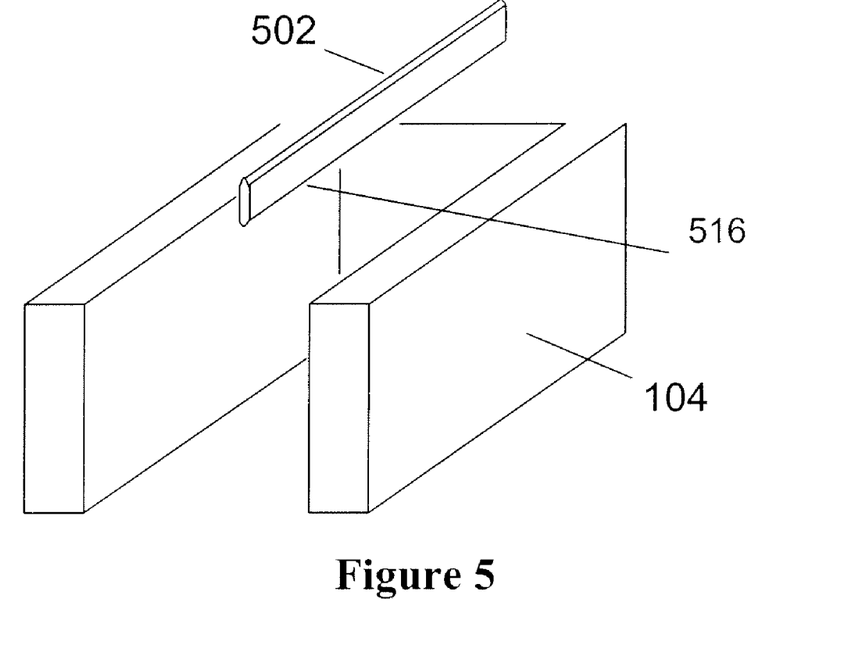
FIG. 5 is a perspective view of another preferred embodiment of a cooling system according to the invention.

FIG. 5 shows another preferred embodiment with an alternate first electrode geometry. As shown in FIG. 5, first electrode 502 has a hexagonal cross-sectional shape, indicating that first electrodes according to the invention are not limited to having round cross-sectional shapes, and that other geometries can be designed based on a variety of factors. In this example, the hexagonal shape provides a sharp edge 516.

Figure 6:
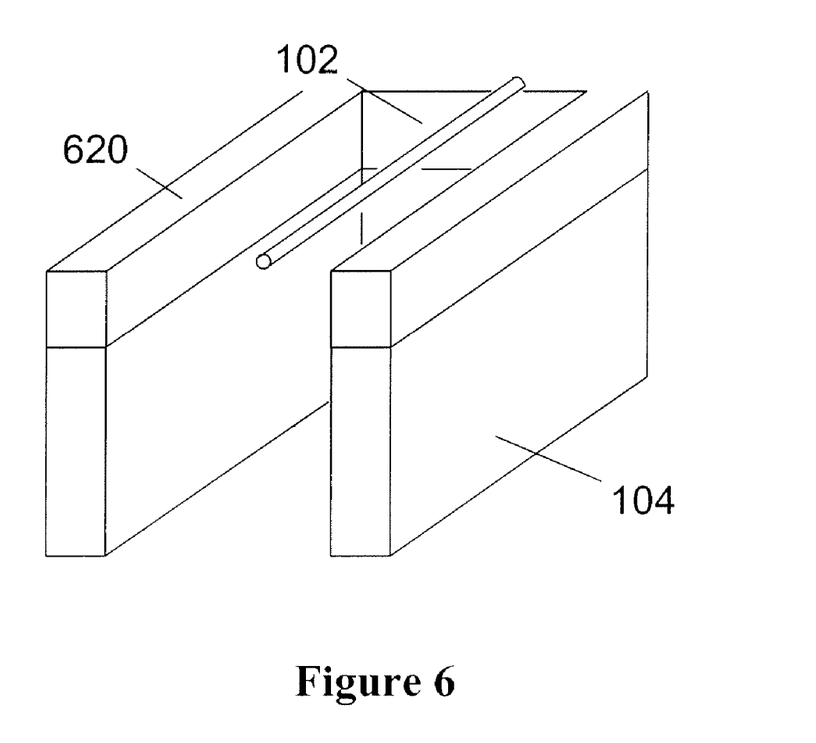
FIG. 6 is a perspective view of another preferred embodiment of a cooling system according to the invention.

In the above embodiments, the EHD pumping occurs in the region between the heat sink and the first electrode. The present invention recognizes that it may be advantageous to confine the pumped fluid such that it is forced to pass through the heat sink channels. Accordingly, another preferred embodiment shown in FIG. 6 includes means to partially or fully surround the pumping zone. As shown in FIG. 6, the cooling system further includes a spacer 620 interposed in the gap between the first electrode and second electrode. The spacer 620 can be a dielectric or a conductor. In the instance that it is conductive, then it can be part of the second electrode. In this case the gap between the first electrode and the second electrode can be established by means such as a substrate for supporting the first electrode as will be described in more detail below. The spacer can also transfer heat from a heat source to augment or replace the heat sink. Another possible function of the spacer is to provide mechanical support for the first electrode element.

Figure 7A:
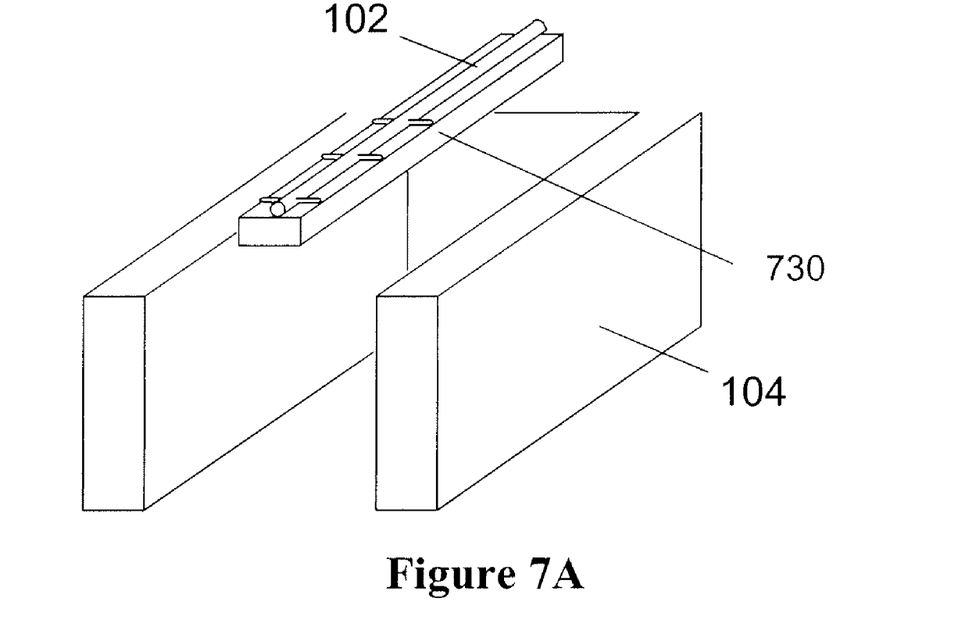
FIGS. 7A to 7C are perspective views of various configurations of another preferred embodiment of a cooling system according to the invention.
Figure 7B:
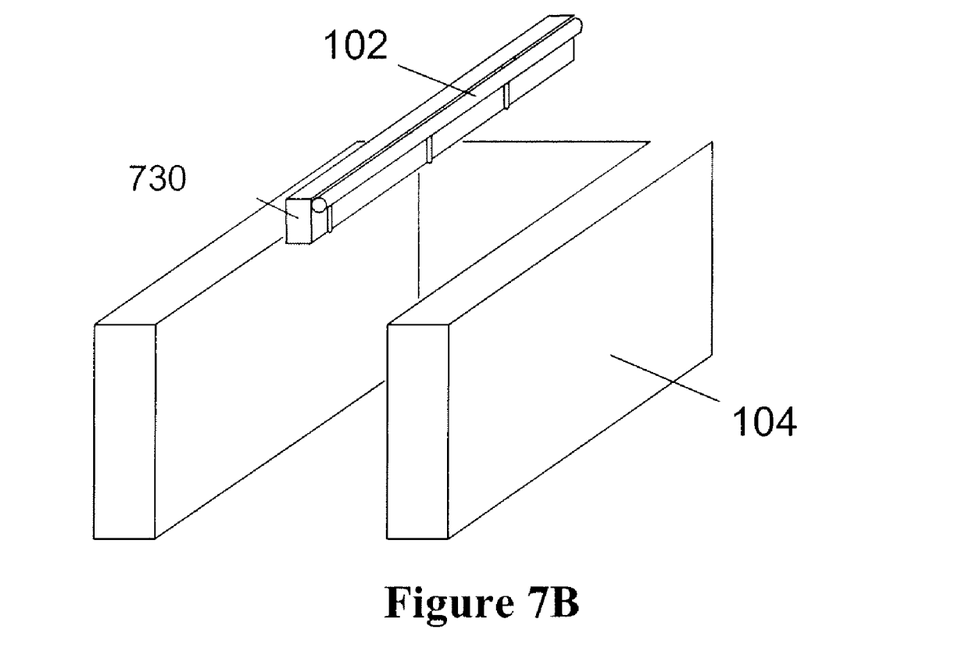
Figure 7C:
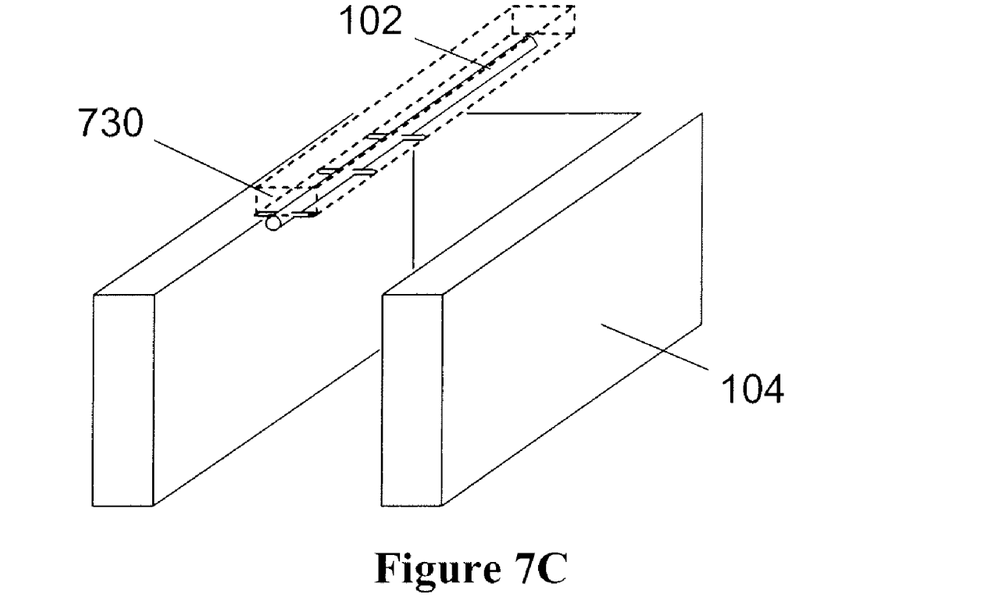

In some embodiments, the first electrodes may not be mechanically strong. This is especially pertinent to micro-scale corona electrodes. To anchor these electrodes, provide stability and to ensure reliable operation they can be supported by an appropriate structure such as a substrate. FIGS. 7A, 7B and 7C show preferred embodiments where the electrodes are located on the upstream wall, the side wall and the downstream wall, respectively, of a substrate 730. It should be apparent that other orientations and angles of the substrate and electrodes with respect to the stream direction are possible.

Figure 7D:
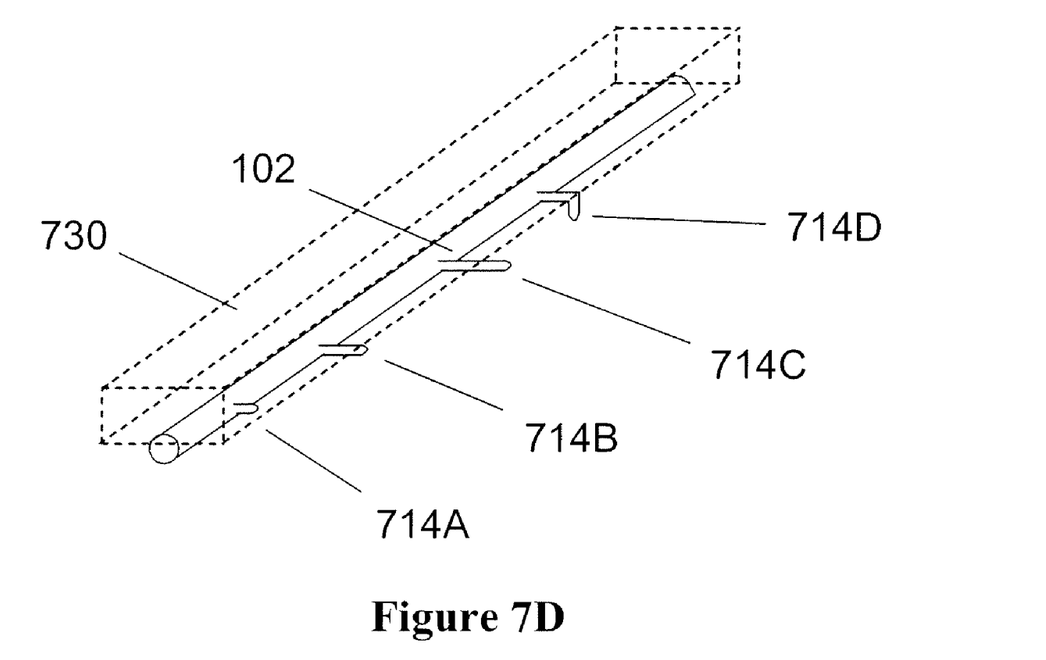
FIG. 7D is a perspective view of various configurations of electrode tips that can be implemented in a cooling system according to the invention.

In embodiments where the first electrodes are in direct contact with a substrate, it is preferable for the electrodes to be terminated at the edge of the substrate surface or to extend a distance beyond the surface. In FIGS. 7B and 7C, the same advantage can be achieved by extending the ends of the electrodes at an angle to the substrate. FIG. 7D illustrates various configurations of first electrodes with respect to a substrate 730. As shown in FIG. 7D, electrode tip 714A is configured to be in contact with substrate 730 but to not extend to the edge of substrate 730. Electrode tip 714B is configured to extend such that it is even with the edge of substrate 730. Electrode tip 714C is configured to extend beyond the edge of substrate 730, and electrode tip 714D is configured to extend at an angle with respect to substrate 730.

In other embodiments, the electrode tips are not in direct contact with the substrate. These embodiments have improved electric field enhancement.

Figure 8:
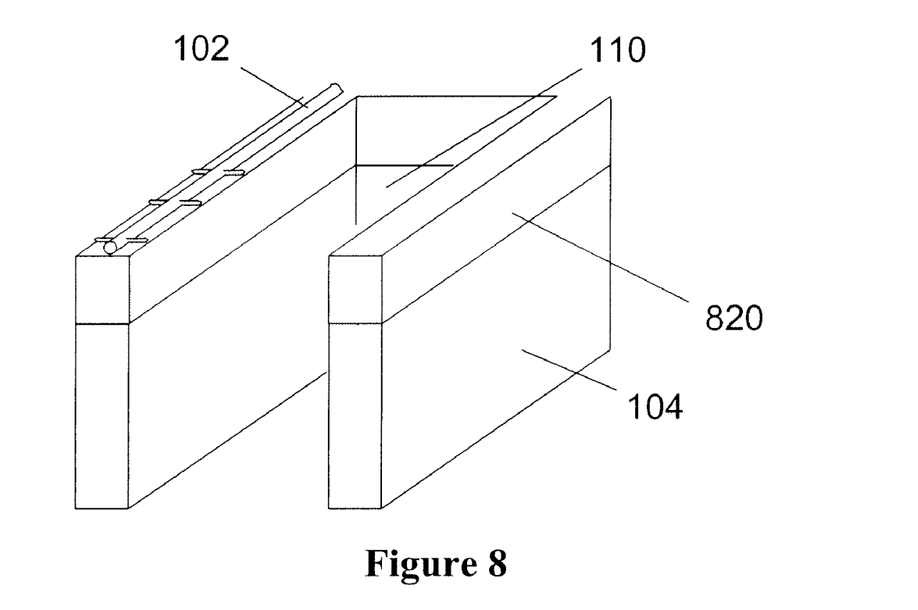
FIG. 8 is a perspective view of another preferred embodiment of a cooling system according to the invention.

FIG. 8 shows an alternative preferred embodiment that can be useful for providing mechanical stability to an otherwise mechanically unstable first electrode structure. As shown in FIG. 8, the first electrode is provided on a substrate 820, which effectively combines a spacer and substrate into a single member. This embodiment further eliminates flow blockage that can be experienced when the first electrode element is located in the center of the channel 110.

AC Voltage

Prototype devices were constructed similar to that shown in FIG. 8 and in accordance with the dimensions of the micro-scale corona techniques of the present invention. The devices were operated in air with DC voltages. Testing of these devices showed that the gas flow rate through the channels tapered off over time when the electrodes were held at a constant potential. It was discovered that under DC operation, surface charge builds up on any dielectric surface, for all types of pumping. This charge retards the field enhancement at the first electrodes, inhibiting the corona discharge and the formation of ions.

Figure 11:
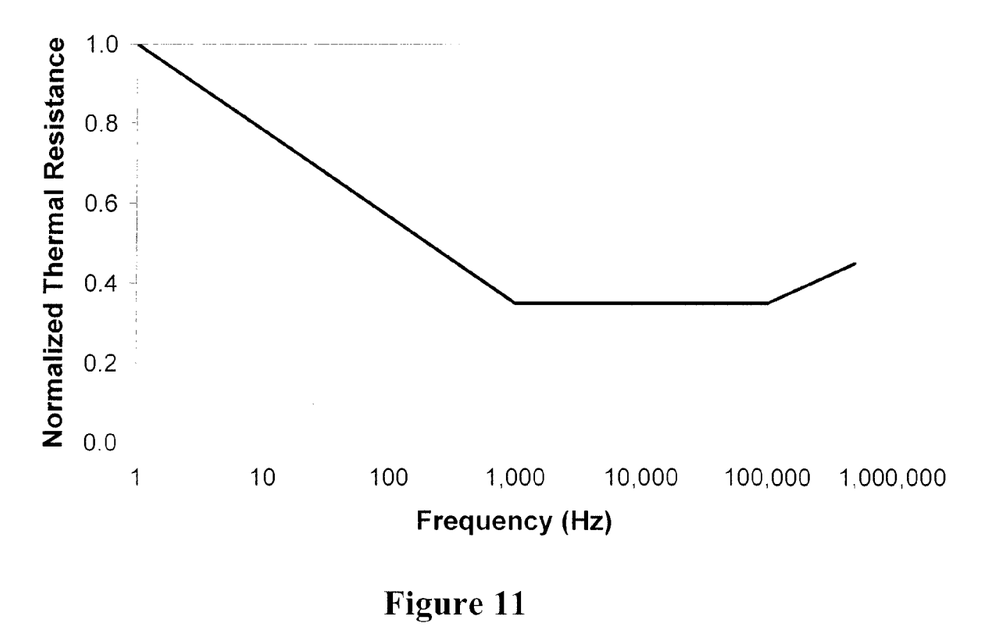
FIG. 11 is a graph showing a trend of a cooling system's thermal resistance as a function of frequency of the applied voltage in a prototype constructed in accordance with the invention.

The present invention recognizes that one way to address this issue is to use an alternating (AC) EHD bus potential as the voltage source (e.g. source 108). The shape of the alternating bus potential is not limited to sinusoidal, but it can be square or pulsed, and variations thereof. The alternating current moves bi-polar ions between the electrodes. Since both positive and negative charges are present in the channel neither species is able to build up on dielectric surfaces. These surfaces remain essentially neutral and hence do not retard the electric field at the first electrodes. FIG. 11 is a graph showing the typical dependence of thermal resistance on the applied frequency in a structure such as that shown in FIG. 8 and using a micro-scale corona wind EHD pumping technique. As shown in this example, the thermal resistance is lowest when the cooling system operates in the frequency range between 1 and 100 kHz. The optimal operating frequency of AC current thus lies in this range.

Cooling System with Large Micro-Channel Array

Figure 9:
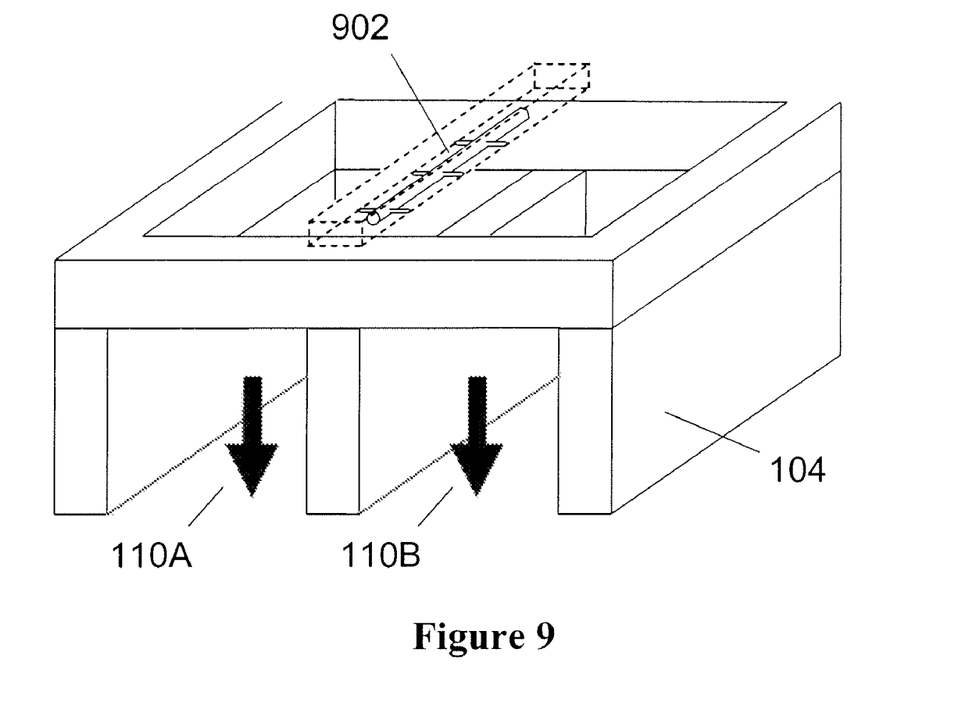
FIG. 9 is a perspective view of another preferred embodiment of a cooling system according to the invention.

A preferred type of heat sink structure to be integrated with an EHD pump mechanism according to the invention is one with a large parallel array of relatively short micro-channels; although many other types of heat sinks can be used. Depending on the heat sink fin width and channel width, however, placing first electrode elements on adjacent fins may reduce the field enhancement and thus the pumping performance. A preferred embodiment that addresses this issue is depicted in FIG. 9 where a single first electrode element 902 is used to provide pumping for multiple channels 110-A and 110-B. This increases the available space between neighboring electrodes and enhances the cooling performance.

Figure 10:
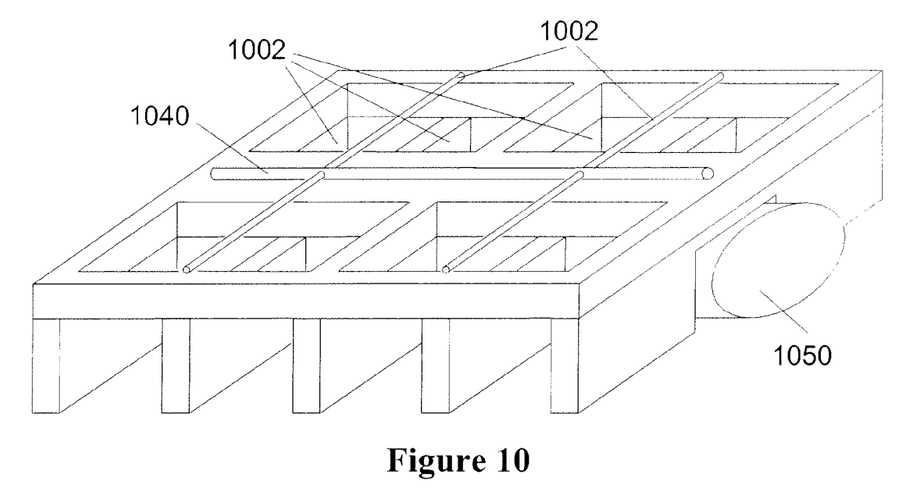
FIG. 10 is a perspective view of another preferred embodiment of a cooling system according to the invention.

One preferred heat sink structure has been described in co-pending U.S. patent application Ser. No. 11/181,106, entitled "Micro-Channel Heat Sink," the contents of which are incorporated by reference herein. The EHD electrodes can be located on either the top or bottom side of the channels in this type of structure. FIG. 10 depicts a preferred embodiment of the invention with an overall heat sink structure such as that described in the co-pending U.S. patent application Ser. No. 11/181,106. As shown in FIG. 10, the array of first electrode elements 1002 is distributed across the inlets of an array of channels 110. The first electrode array is electrically tied to a central corona bus 1040 to which the voltage is applied.

It should be noted that FIG. 10 shows an embodiment of a cooling system that employs a heatpipe 1050 as means to deliver heat from a heat source to the heat sink channel walls. In embodiments including a corona-type EHD pumping system, the heatpipe 1050 can also act as a second electrode. It should be noted that in other embodiments, the heat sink structure may be more directly thermally coupled to a heat source rather than remotely through a heatpipe.

Cooling System with Controlled Breakdown Ion Generation

Figure 12A:
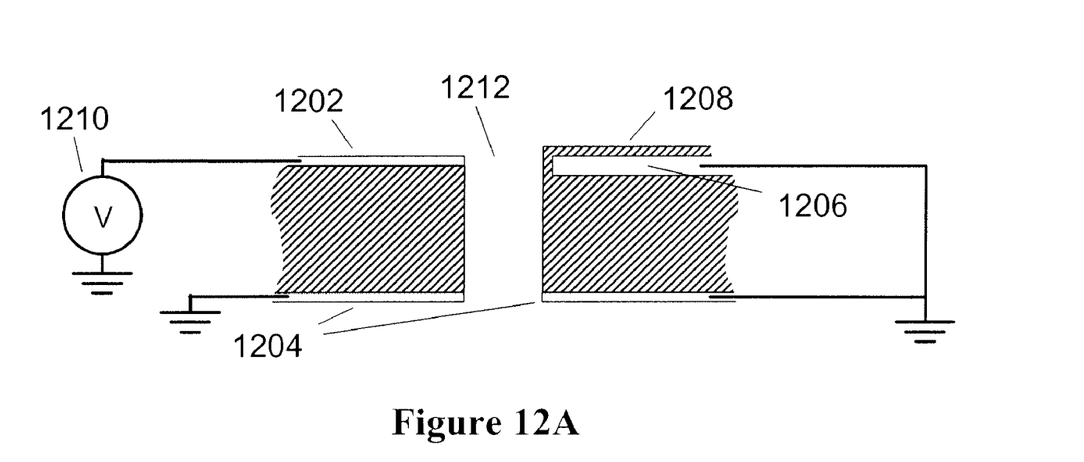
FIGS. 12A and 12B illustrate a preferred implementation of current pulsing ion generation techniques in a cooling apparatus according to the invention.
Figure 12B:
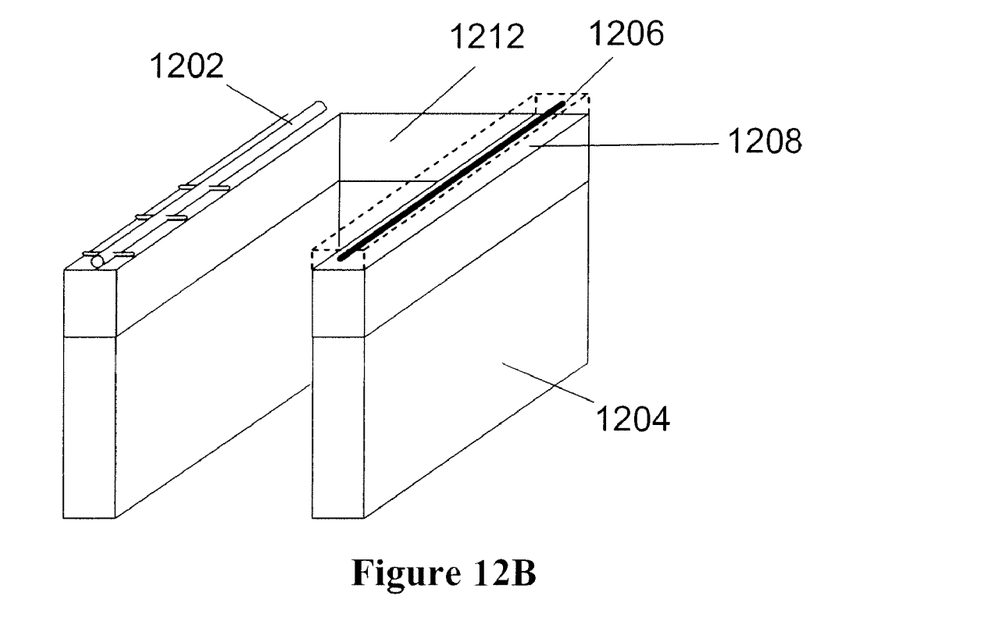

As mentioned above, although the same overall heat sink structure and ion-generating electrodes can be used, the embodiments shown in FIGS. 1 through 10 may require additional electrodes and structure to accomplish the EHD pumping method described in co-pending U.S. patent application Ser. No. 11/271,092. FIG. 12A shows schematically how various embodiments of the invention can be realized in an actual application. The example implementation of FIGS. 12A and 12B contain a first electrode 1202 and second electrode 1204 similar to the corona wind embodiments. In addition, this embodiment includes a third electrode 1206. (It should be noted that the designators "second" and "third" electrodes are reversed between this and the co-pending application). FIG. 12A shows a cross-sectional view of a representative cooling channel. FIG. 12B illustrates one example of how the additional electrode 1206 may be embodied in a heat sink structure such as that described in connection with FIG. 8 above.

The material for the third electrode 1206 can be aluminum or any conductor, having a thickness of about 500 nm and can be covered by a thin dielectric 1208 of, for example, polyimide having a thickness of about 1 micron. Voltage source 1210 is on the order of 1000 V and is temporally controlled as described in the co-pending application to first cause the gas gap between electrodes 1202, 1206 to begin to break down. The process is halted as charge accumulates on the surface of the dielectric 1208 covering the electrode 1206. Thus the dielectric coating acts as a capacitor. However, the thin dielectric 1208 allows charge to slowly leak off of the surface and to the electrode. Thus the dielectric coating also acts as a resistor by allowing charge to leak through and discharge the capacitor. Ions are formed at the channel inlet 1212 and are drawn by a secondary field established by the second electrode 1204, which is held to a ground potential.

Cooling System with Remote Heat Dissipation

The cooling system shown in FIG. 10 is one embodiment of a system according to the invention that is capable of being located away from the heat source. As described above, this device is thermally coupled to the heat source by one or more heat pipes. In the example shown in FIG. 10, the heat pipe runs along the center of the heat sink, although several other configurations are feasible. Heat is transported from the heat pipe to the base of each fin that forms the heat sink channels. The simple conduction path allows the heat sink to be made thinner than would be possible without the heat pipe. The short conduction paths also make it feasible to use many different materials for the heat sink (aluminum, silicon, carbon fiber, steel, alumina etc.), since high thermal conductivity is not a necessary material requirement.

Figure 13:
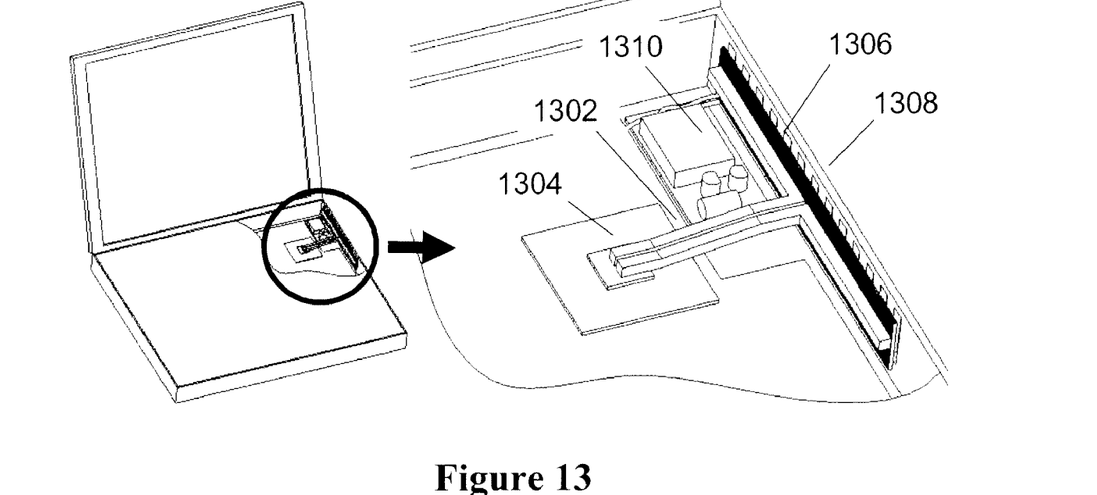
FIG. 13 is a drawing showing a preferred embodiment of the EHD gas flow cooling system in a mobile computer application.

One possible application of a complete cooling system according to the invention for a laptop computer is shown in FIG. 13. The complete system has a heat pipe 1302 to transport heat from the central processing unit 1304 to the EHD gas flow heat sink 1306. The heat pipe can be a standard, commercially available device consisting of a two-phase fluid and a wick inside a tube, but the invention is not limited to such particular devices. The heat pipe device efficiently transports heat by evaporating fluid from one end of the tube and condensing it to the other. The heat sink is located near a side wall with a vent 1308 so that hot gas is exhausted outside of the computer in this example. A power supply 1310 provides alternating current to drive the EHD gas flow unit.

The cooling system of the invention can also be applied to other electronic equipment such as desktop computers, servers, communication equipment, cable set-top boxes, video game machines, digital and analog televisions and displays, hand-held personal digital assistants, cell phones, etc.

Construction

A fabrication process for constructing a micro-channel heat sink with EHD gas flow is unique by itself and is another aspect of the invention as will now be described in more detail in connection with a preferred embodiment illustrated in FIGS. 14A to 14D.

Figure 14:
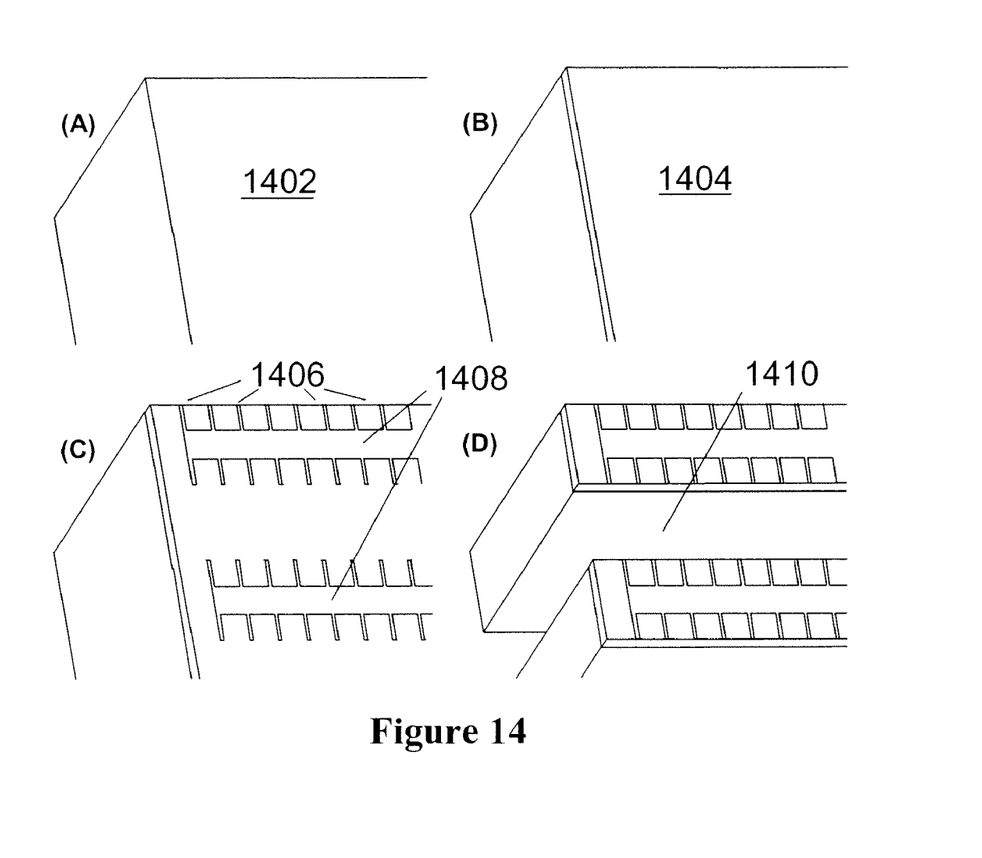
FIGS. 14A to 14D shows the sequence of one possible micro-fabrication process for making a micro-scale EHD cooling system according to the invention.

As shown in FIG. 14A, the process starts with a substrate material 1402 such as an electrically conductive wafer comprised of silicon, aluminum, doped SiC, carbon fiber or copper. Next, in FIG. 14B, a dielectric material is deposited or grown on the surface 1404 (e.g., a thermal oxide can be grown on silicon, aluminum can be anodized or a thick film photoresist can be deposited). A sheet of dielectric material can also be bonded to the substrate (e.g., a sheet of glass, quartz, borofloat or Plexiglas can be attached to the substrate). Next, in FIG. 14C, photolithography techniques can be used to pattern the first electrodes 1406 and bus 1408 on the surface of the dielectric. The final step shown in FIG. 14D is to mechanically cut the micro-channels 1410 with a diamond dicing saw or wire electrostatic discharge machine (EDM), or chemically etch away the excess material with dry and wet etching techniques. A combination of mechanical and chemical techniques can also be utilized.

Although the present invention has been particularly described with reference to the preferred embodiments thereof, it should be readily apparent to those of ordinary skill in the art that changes and modifications in the form and details may be made without departing from the spirit and scope of the invention. It is intended that the appended claims encompass such changes and modifications.

What is claimed is:

1. A cooling apparatus, comprising:
   a channel defined by fins of a heat sink, the fins extending in a longitudinal direction from a surface of the heat sink substantially parallel to each other and separated by the channel; and
   an electro-hydrodynamic (EHD) pump coupled to the channel that forces gas to flow from a channel inlet to a channel outlet through the channel in a lengthwise direction of the channel that is orthogonal to the longitudinal direction,
   wherein the EHD pump comprises first and second electrodes, wherein the first electrode is comprised of a wire having a cross-sectional shape and being disposed substantially parallel to the longitudinal direction, and wherein the second electrode is integrally formed in at least one of the fins, and wherein the first electrode is separated from the fins by a gas gap, and wherein the EHD pump causes ions to be generated along the length of the wire across the gas gap and accelerated toward the at least one fin, such that gas is pumped through the channel from the inlet towards the outlet of the channel.

2. An apparatus according to claim 1, further comprising a heatpipe in thermal contact with the heat sink.

3. An apparatus according to claim 2, wherein the heatpipe is in electrical contact with the fins.

4. An apparatus according to claim 1, wherein the EHD pump further comprises a voltage source that establishes an electric field between the first and second electrodes so as to generate ions that flow between the first and second electrodes.

5. An apparatus according to claim 4, wherein the ions are generated using a corona wind technique.

6. An apparatus according to claim 4, wherein the ions are generated using a micro-scale corona wind technique.

7. An apparatus according to claim 4, wherein the ions are generated using a temporally controlled dielectric breakdown technique.

8. An apparatus according to claim 4, wherein the cross-sectional shape is round.

9. An apparatus according to claim 4, wherein the first electrode has an effective diameter of less than 1 mm.

10. An apparatus according to claim 1, further comprising a substrate to which the wire is attached.

11. An apparatus according to claim 1, wherein the wire is comprised of a main element and a plurality of secondary tips protruding therefrom.

12. An apparatus according to claim 11, further comprising a substrate to which the wire is attached.

13. An apparatus according to claim 12, wherein the wire is attached to an upstream side of the substrate with respect to a direction of the gas flow in the channel.

14. An apparatus according to claim 12, wherein the wire is attached to a downstream side of the substrate with respect to a direction of the gas flow in the channel.

15. An apparatus according to claim 12, wherein the wire is attached to a side wall that is perpendicular to both an upstream and downstream side of the substrate with respect to a direction of the gas flow in the channel.

16. An apparatus according to claim 12, wherein the wire is attached to a side wall that is at an oblique angle to both an upstream and downstream side of the substrate with respect to a direction of the gas flow in the channel.

17. An apparatus according to claim 12, wherein the secondary tips extend to an edge of the substrate.

18. An apparatus according to claim 12, wherein the secondary tips extend beyond an edge of the substrate.

19. An apparatus according to claim 18, wherein the secondary tips are angled in portions where they extend beyond the edge of the substrate with respect to other portions that do not extend beyond the edge.

20. An apparatus according to claim 4, wherein the voltage source provides an AC current.

21. An apparatus according to claim 20, wherein the AC current is in a frequency range between 1 and 100 kHz.

22. An apparatus according to claim 4, wherein the voltage source provides a DC current.

23. An apparatus according to claim 1, further comprising a spacer that at least partially surrounds the gas gap.

24. An apparatus according to claim 23, wherein the spacer comprises a conductive material.

25. An apparatus according to claim 23, wherein the spacer comprises a dielectric material.

26. An apparatus according to claim 25, wherein the first electrode is attached to the spacer.

27. An apparatus according to claim 1, wherein the channel is defined by first and second fins, the apparatus further comprising a second channel defined by the first fin and a third fin, and further comprising a second EHD pump comprising the first electrode and another second electrode integrally formed in the third fin and separated from the first electrode by a second gap adjacent an inlet of the second channel.

28. An apparatus according to claim 1, wherein the channel has a length between a first end of the fins and a second opposite end of the fins, and has openings at the first and second ends, and wherein the EHD pump at least forces the gas to flow from the first end to the second end and through the opening at the second end.

29. An apparatus according to claim 28, wherein the first electrode is adjacent to the first end and separated therefrom by the gas gap.

30. An apparatus according to claim 1, wherein the channel has a width corresponding to the separation between the fins, and a length defined by a first opening at a first end of the fins adjacent the gas gap and a second opening at an opposite end of the fins, the width and the length both being substantially orthogonal to the longitudinal direction.

31. An apparatus according to claim 30, wherein the width is less than 5 mm and the length is less than 100 mm.

32. A cooling apparatus comprising:
   a heat sink comprising a plurality of separated fins that respectively define a plurality of channels, wherein all of the fins extend in a longitudinal direction substantially parallel to each other and separated by the respective channels;
   a substrate; and
   a plurality of electro-hydrodynamic (EHD) pumps coupled to the heat sink and the substrate that respectively force gas to flow through the channels,
   wherein the EHD pumps are comprised of a plurality of first electrodes and a plurality of second electrodes, and wherein the first electrodes are each comprised of a wire having a cross-sectional shape attached to the substrate, and wherein the second electrodes are integrally formed in the heat sink, and wherein the first electrodes are each separated from the fins by a gas gap, and wherein each of the wires is disposed substantially parallel to the longitudinal direction, and wherein the EHD pumps cause ions to be generated along the length of the wires across the gas gaps and accelerated toward the second electrodes, such that gas is pumped through the channels.

33. A cooling apparatus according to claim 32, wherein an electric field is respectively established between the first electrodes and second electrodes so as to generate ions which promotes the gas flow, and wherein certain of the first electrodes are commonly used by two or more EHD pumps.

34. An apparatus according to claim 32, further comprising an electrical bus to which the first electrodes are coupled.

35. An apparatus according to claim 32, wherein:
each of the channels has a width corresponding to the separation between the respective fins, and a length defined by a first opening at a first end of the fins adjacent the gas gap and a second opening at an opposite end of the fins, the width and the length both being substantially orthogonal to the longitudinal direction, and
the width of each of the channels is less than 5 mm and the length of each of the channels is less than 100 mm.

36. An apparatus according to claim 32, wherein the EHD pumps generate ions using a corona wind technique.

37. An apparatus according to claim 32, wherein the EHD pumps generate ions using a micro-scale corona wind technique.

38. An apparatus according to claim 32, wherein the EHD pumps generate ions using a temporally controlled dielectric breakdown technique.

39. A cooling apparatus according to claim 32, wherein the channels each have a length between a first end and a second opposite end thereof, and have openings at the first and second ends, and wherein the EHD pumps at least force the gas to flow from the first ends to the second ends and through the openings at the second ends.

40. An apparatus according to claim 39, wherein each of the first electrodes are adjacent to the first ends and separated therefrom by the gas gap.

\* \* \* \* \*